United States Patent
Xiao et al.

(10) Patent No.: US 12,446,214 B2
(45) Date of Patent: Oct. 14, 2025

(54) SEMICONDUCTOR STRUCTURE

(71) Applicant: CHANGXIN MEMORY TECHNOLOGIES, INC., Hefei (CN)

(72) Inventors: Jianfeng Xiao, Hefei (CN); Xiaojie Li, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 511 days.

(21) Appl. No.: 18/150,245

(22) Filed: Jan. 5, 2023

(65) Prior Publication Data

US 2023/0422489 A1 Dec. 28, 2023

Related U.S. Application Data

(63) Continuation of application No. PCT/CN2022/112232, filed on Aug. 12, 2022.

(30) Foreign Application Priority Data

Jun. 22, 2022 (CN) .......................... 202210714285.X

(51) Int. Cl.
*H10B 12/00* (2023.01)

(52) U.S. Cl.
CPC ......... *H10B 12/488* (2023.02); *H10B 12/482* (2023.02); *H10B 12/50* (2023.02)

(58) Field of Classification Search
CPC ..... H10B 12/488; H10B 12/482; H10B 12/50
See application file for complete search history.

(56) References Cited

U.S. PATENT DOCUMENTS 9,589,978 B1 3/2017 Yip
9,978,752 B2 5/2018 Kim et al.
(Continued)

FOREIGN PATENT DOCUMENTS

CN 107134458 A 9/2017
CN 109841630 A 6/2019
(Continued)

OTHER PUBLICATIONS

International Search Report cited in PCT/CN2022/112232 mailed Dec. 19, 2022, 8 pages.
(Continued)

*Primary Examiner* — Richard A Booth
(74) *Attorney, Agent, or Firm* — Kilpatrick Townsend & Stockton LLP

(57) ABSTRACT

The present disclosure provides a semiconductor structure. The semiconductor structure includes: a plurality of word lines extending along a first direction and arranged at intervals along a third direction; a plurality of semiconductor channels extending along a second direction and arranged at intervals along the third direction, wherein the word line surrounds the semiconductor channel along the third direction; a stepped structure including a plurality of steps, wherein the step is in contact with and connected to the word line, a height of a top surface of any one of the steps is different from a height of a top surface of another one of the steps along the third direction, the steps are arranged in an array along the first direction and the second direction; and a plurality of contact structures, wherein the contact structure is in contact with and connected to the step.

15 Claims, 9 Drawing Sheets

(56) References Cited

U.S. PATENT DOCUMENTS

| | | |
|---|---|---|
| 10,546,876 B2 | 1/2020 | Lee et al. |
| 10,607,995 B2 | 3/2020 | Roberts et al. |
| 10,784,272 B2 | 9/2020 | Lee |
| 11,094,699 B1 | 8/2021 | Brewer et al. |
| 2011/0204420 A1 | 8/2011 | Kim et al. |
| 2012/0012913 A1 | 1/2012 | Lee |
| 2021/0012828 A1 | 1/2021 | Kim et al. |
| 2022/0122976 A1 | 4/2022 | Kim |
| 2022/0130834 A1 | 4/2022 | Lee et al. |
| 2023/0020173 A1* | 1/2023 | Xiao .................... H10B 12/488 |
| 2023/0413537 A1* | 12/2023 | Shao .................. H10D 30/6728 |

FOREIGN PATENT DOCUMENTS

| | | |
|---|---|---|
| CN | 110520989 A | 11/2019 |
| CN | 113745224 A | 12/2021 |
| CN | 114023703 A | 2/2022 |
| CN | 114373735 A | 4/2022 |
| CN | 114530419 A | 5/2022 |
| TW | 202103303 A | 1/2021 |

OTHER PUBLICATIONS

International Search Report cited in PCT/CN2022/107125 mailed Dec. 19, 2022, 8 pages.

* cited by examiner

SEMICONDUCTOR STRUCTURE

CROSS-REFERENCE TO RELATED APPLICATIONS

This is a continuation of International Application No. PCT/CN2022/112232, filed on Aug. 12, 2022, which claims the priority to Chinese Patent Application No. 202210714285.X, titled "SEMICONDUCTOR STRUCTURE" and filed on Jun. 22, 2022. The entire contents of International Application No. PCT/CN2022/112232 and Chinese Patent Application No. 202210714285.X are incorporated herein by reference.

TECHNICAL FIELD

The present disclosure relates to, but is not limited to, a semiconductor structure.

BACKGROUND

In two-dimensional (2D) or planar semiconductor devices, memory cells are all horizontally arranged. Therefore, an integration density of the 2D or planar semiconductor devices is determined by an area occupied by a memory cell per unit. In this case, the integration density of the 2D or planar semiconductor devices is greatly affected by the technique of forming fine patterns, causing a limit to a continuous increase of the integration density of the 2D or planar semiconductor devices. Therefore, semiconductor devices are developing towards three-dimensional (3D) semiconductor devices.

However, currently, for the layout of memory cells in a 3D semiconductor device, a brand new design is required for manners of connecting functional devices. For example, while reducing a layout area of a semiconductor device, how to lead out a word line in the semiconductor device to achieve electrical connection to a peripheral logic circuit is a problem to be urgently considered.

SUMMARY

An overview of the subject matter detailed in the present disclosure is provided below, which is not intended to limit the protection scope of the claims.

The present disclosure provides a semiconductor structure, including: a plurality of word lines extending along a first direction and arranged at intervals along a third direction; a plurality of semiconductor channels extending along a second direction and arranged at intervals along the third direction, wherein the word line surrounds the semiconductor channel along the third direction, and the first direction, the second direction, and the third direction intersect one another; a stepped structure including a plurality of steps, wherein the step is in contact with and connected to the word line, a height of a top surface of any one of the steps is different from a height of a top surface of another one of the steps along the third direction, the steps are arranged in an array along the first direction and the second direction, and adjacent ones of the steps are electrically insulated from each other; and a plurality of contact structures, wherein the contact structure is in contact with and connected to the step, and any two of the contact structures are spaced from each other.

Other aspects of the present disclosure are understandable upon reading and understanding of the accompanying drawings and detailed description.

BRIEF DESCRIPTION OF THE DRAWINGS

The accompanying drawings incorporated into the specification and constituting a part of the specification illustrate the embodiments of the present disclosure, and are used together with the description to explain the principles of the embodiments of the present disclosure. In these accompanying drawings, similar reference numerals represent similar elements. The accompanying drawings in the following description illustrate some rather than all of the embodiments of the present disclosure. Those skilled in the art may obtain other accompanying drawings based on these accompanying drawings without creative efforts.

DETAILED DESCRIPTION

The technical solutions in the embodiments of the present disclosure are described below clearly and completely with reference to the accompanying drawings in the embodiments of the present disclosure. Apparently, the described embodiments are merely some rather than all of the embodiments of the present disclosure. All other embodiments obtained by those skilled in the art based on the embodiments of the present disclosure without creative efforts should fall within the protection scope of the present disclosure. It should be noted that the embodiments in the present disclosure and features in the embodiments may be combined with each other in a non-conflicting manner.

It can be learned from the background art that the manner of achieving the electrical connection between the word line and the peripheral logic circuit in the semiconductor device needs to be optimized.

The embodiments of the present disclosure provide a semiconductor structure, where word lines are arranged at intervals along a third direction, different word lines locate in different height intervals in a third direction, steps in a stepped structure are in contact with and connected to the word lines, and a height of a top surface of any of the steps is different from a height of a top surface of another step along the third direction, to facilitate a one-to-one correspondence between the steps and the word lines, such that the word lines are lead out through the steps; and further, contact structures are in contact with and connected to the steps to further lead out the word lines, and any two of the contact structures are spaced from each other, to facilitate the prevention of contact between contact structures corresponding to different word lines, such that interference between the different word lines is reduced. In addition, the steps are arranged in an array along the first direction and the second direction, to avoid a case in which the stepped structure extends along only the first direction or the second direction, such that layout space is appropriately utilized, which is beneficial to reducing a total layout area of the semiconductor structure.

The embodiments of the present disclosure are described in detail below with reference to the accompanying drawings. However, those skilled in the art may understand that in each embodiment of the present disclosure, many technical details are proposed to help readers better understand the embodiments of the present disclosure. However, the technical solutions claimed in the embodiments of the present disclosure can still be implemented based on variations and modifications of the following embodiments even without the technical details.

Figure 5:
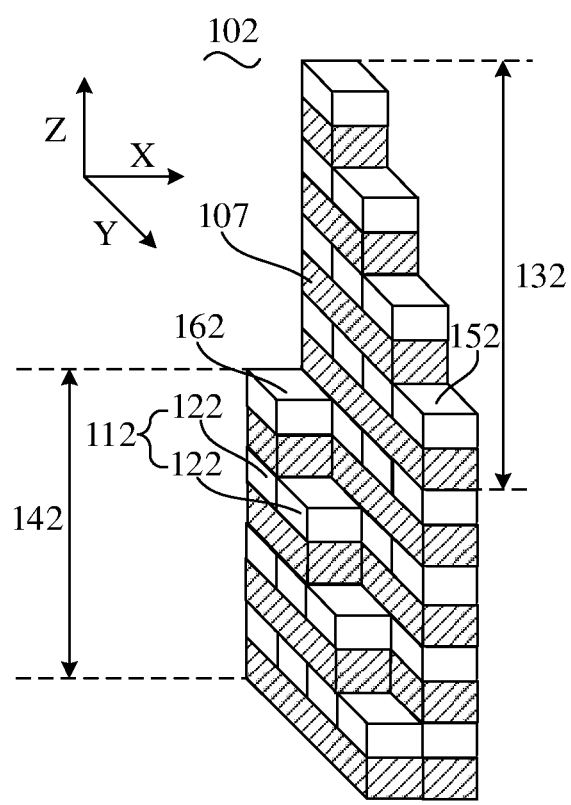
FIG. 5 is a schematic 3D structural diagram of a stepped structure in the semiconductor structures provided in FIG. 3 and FIG. 4.
Figure 6:
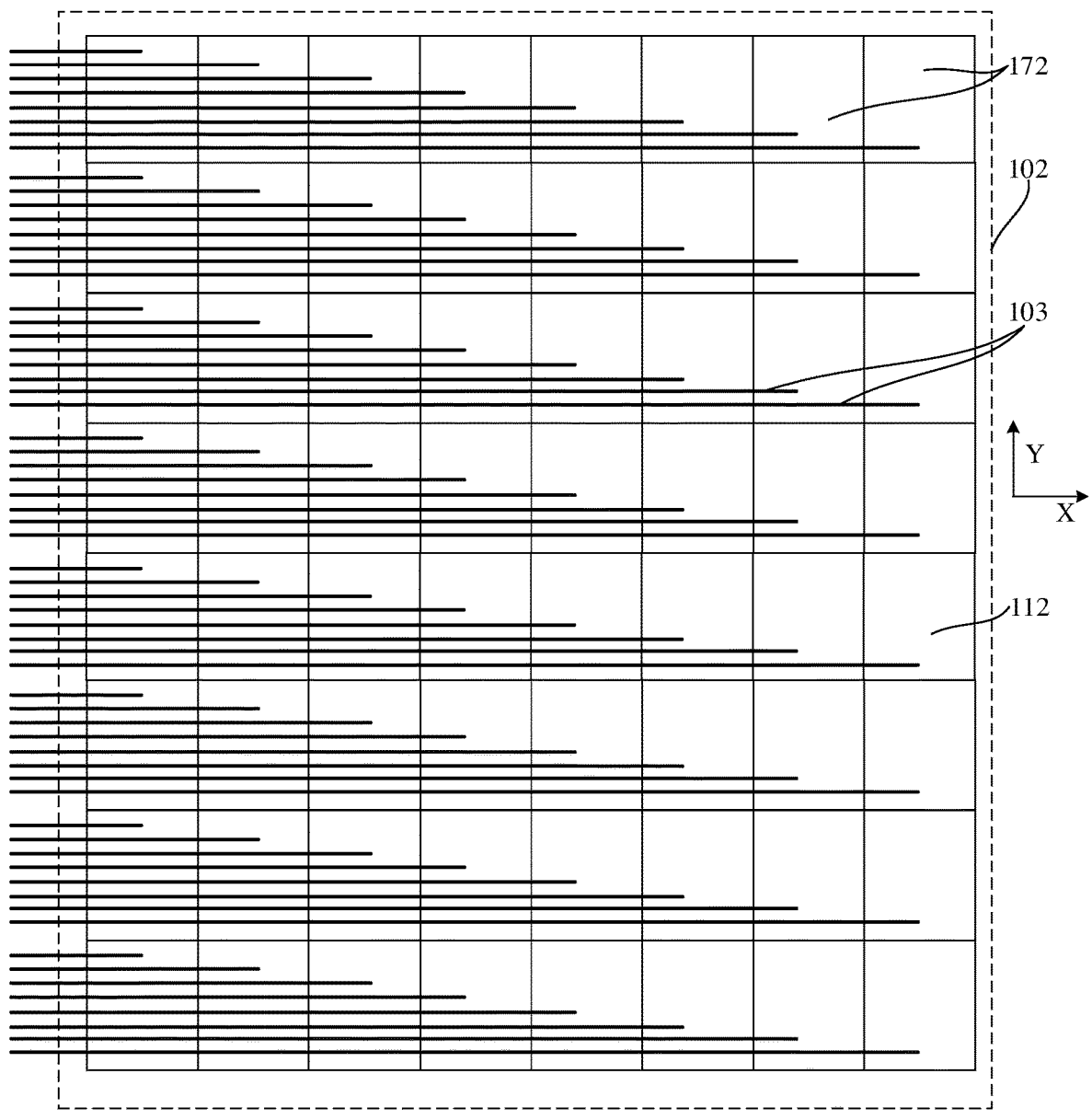
FIG. 6 is a schematic structural diagram of a top view of a stepped structure and a contact structure in a semiconductor structure according to an embodiment of the present disclosure.
Figure 7:
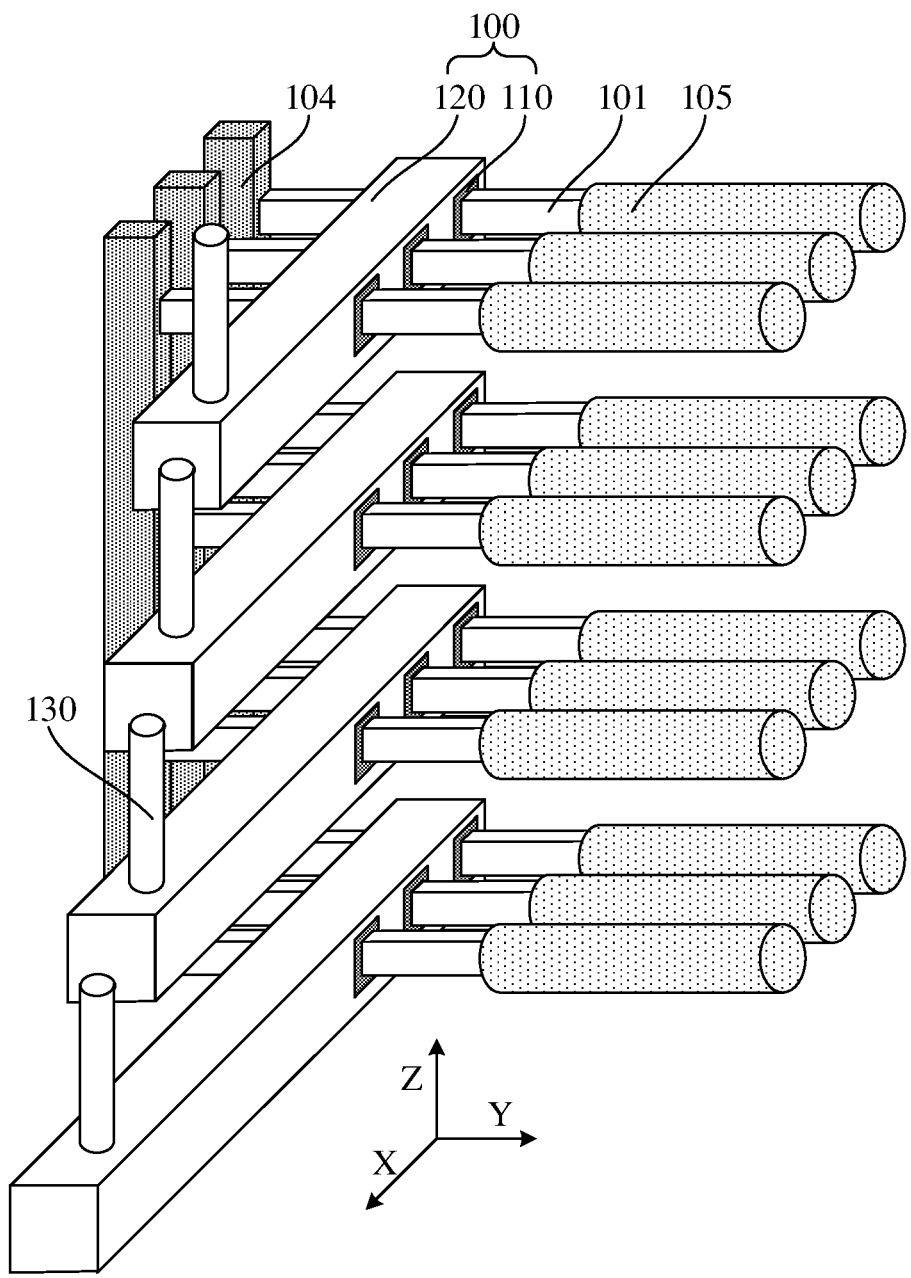
FIG. 7 is a schematic 3D structural diagram of a semiconductor structure.
Figure 8:
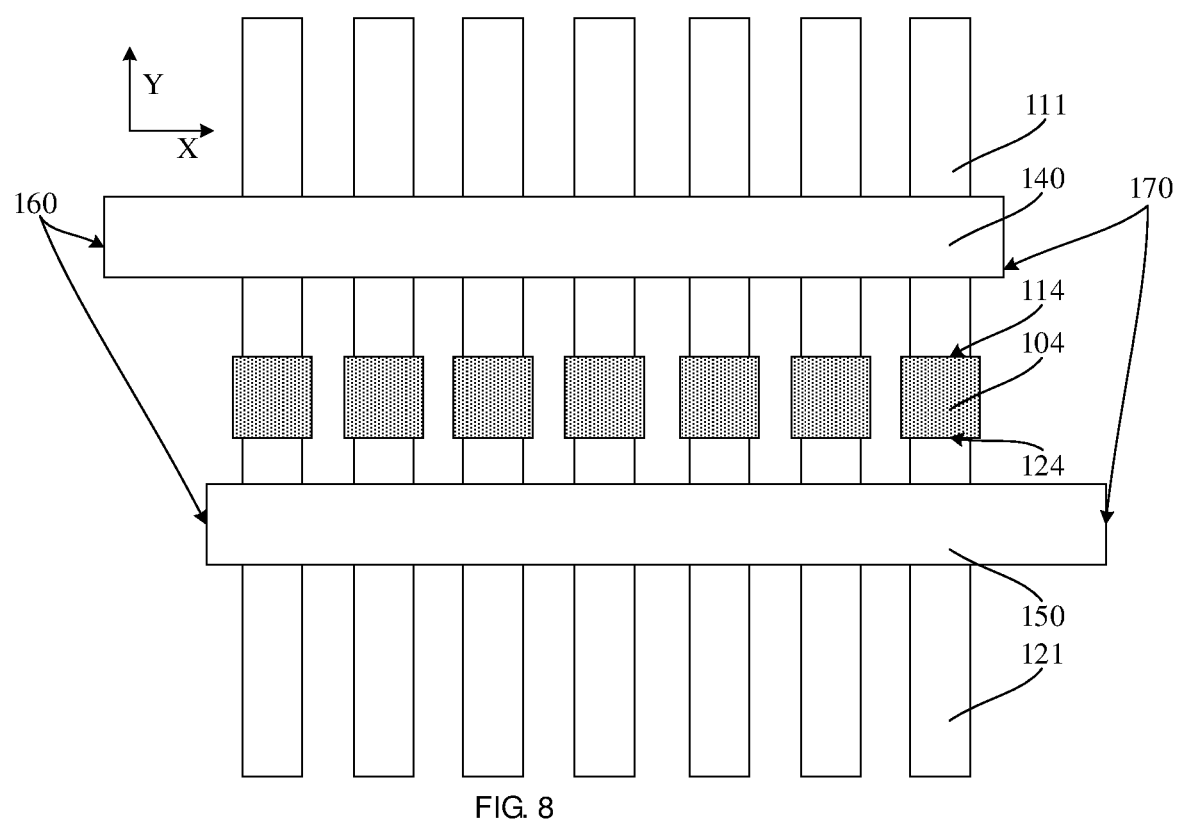
FIG. 8 is a schematic structural diagram of a top view of a bit line, a word line, and a semiconductor channel in a semiconductor structure according to an embodiment of the present disclosure.
Figure 9:
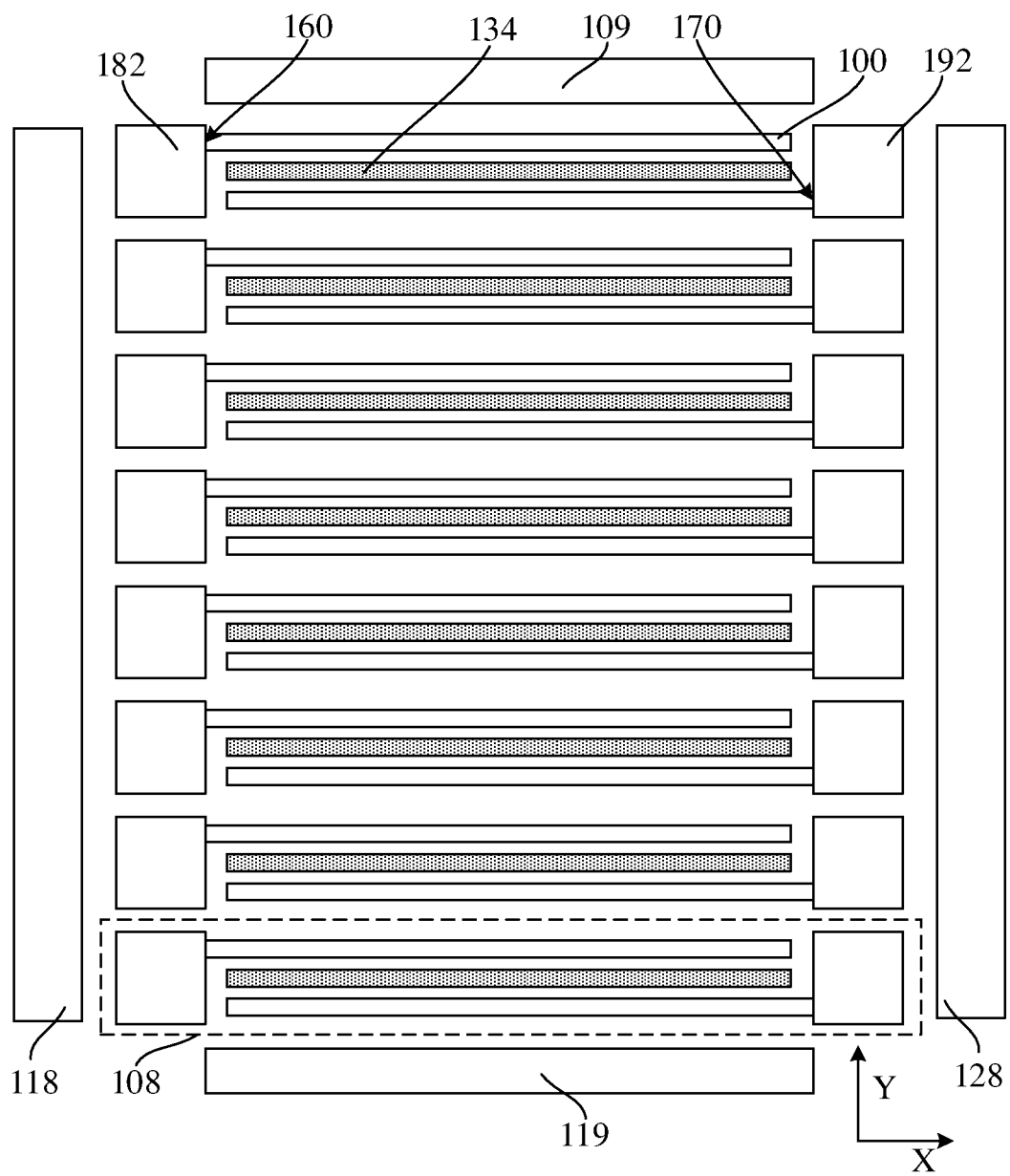
FIG. 9 is a schematic structural diagram of a top view of a semiconductor structure according to an embodiment of the present disclosure.

An embodiment of the present disclosure provides a semiconductor structure. A manufacturing method of a semiconductor structure provided by an embodiment of the present disclosure is described in detail below with reference to the accompanying drawings. FIG. 1 to FIG. 4 are four schematic 3D structural diagrams of a semiconductor structure according to an embodiment of the present disclosure; FIG. 5 is a schematic 3D structural diagram of a stepped structure in the semiconductor structures provided in FIG. 3 and FIG. 4; FIG. 6 is a schematic structural diagram of a top view of a stepped structure and a contact structure according to an embodiment of the present disclosure; FIG. 7 is a schematic 3D structural diagram of a semiconductor structure; FIG. 8 is a schematic structural diagram of a top view of a bit line, a word line, and a semiconductor channel in a semiconductor structure according to an embodiment of the present disclosure; and FIG. 9 is a schematic structural diagram of a top view of a semiconductor structure according to an embodiment of the present disclosure.

Figure 1:
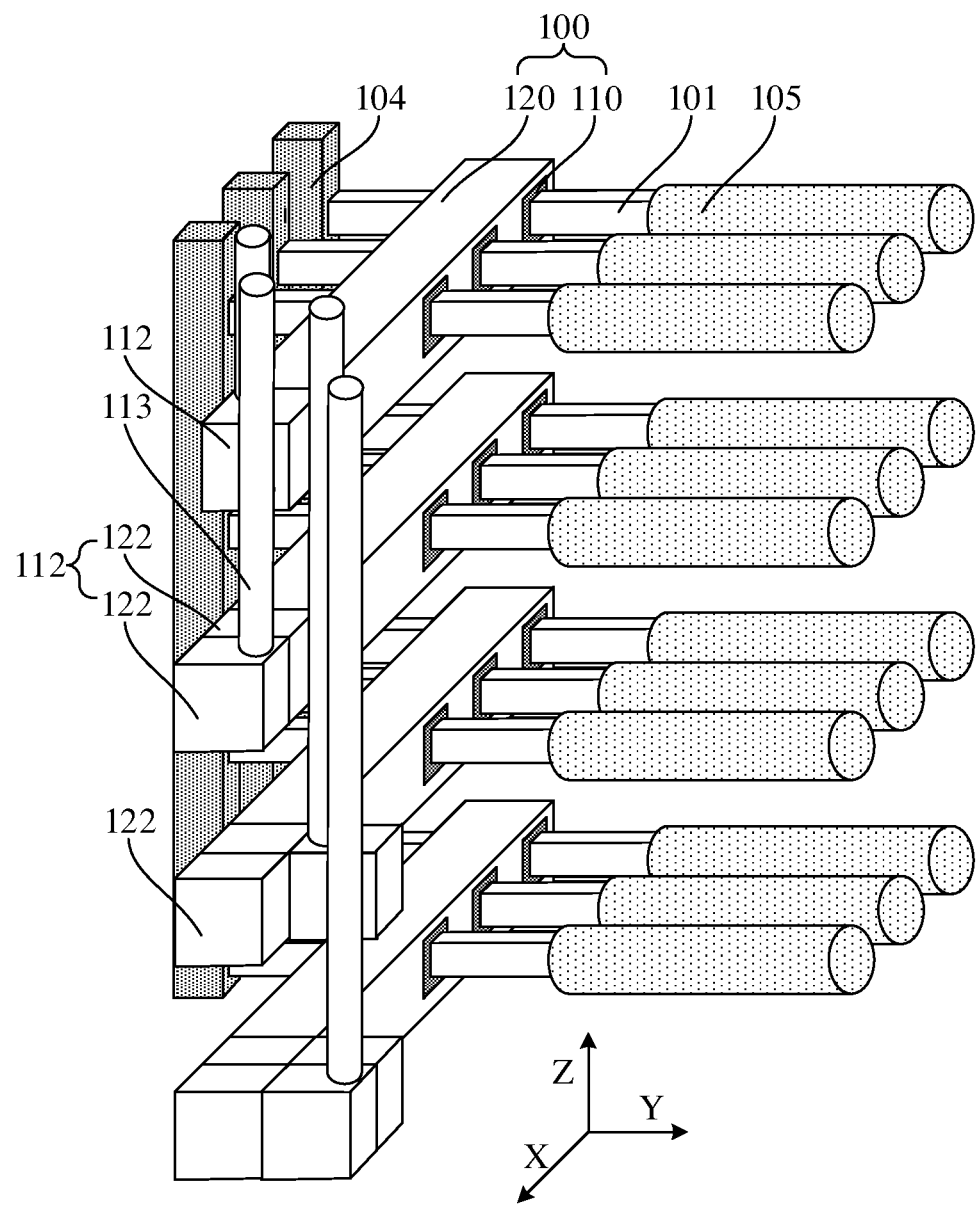
FIG. 1 to FIG. 4 are four schematic three-dimensional (3D) structural diagrams of a semiconductor structure according to an embodiment of the present disclosure.

It should be noted that, for ease of description and clear illustration of the semiconductor structure, FIG. 1 to FIG. 6, FIG. 8, and FIG. 9 are all partial schematic structural diagrams of a semiconductor structure according to an embodiment of the present disclosure. In addition, to more clearly show the distribution of steps in a stepped structure, only part of a contact structure is illustrated in FIG. 1, and the contact structure is not illustrated in FIG. 3.

Referring to FIG. 1 to FIG. 5, the semiconductor structure includes: a plurality of word lines 100 extending along a first direction X and arranged at intervals along a third direction Z; a plurality of semiconductor channels 101 extending along a second direction Y and arranged at intervals along the third direction Z, where the word line 100 surrounds the semiconductor channel 101 along the third direction Z, and the first direction X, the second direction Y, and the third direction Z intersect one another; a stepped structure 102 including a plurality of steps 112, where the step 112 is in contact with and connected to the word line 100, a height of a top surface of any one of the steps 112 is different from a height of a top surface of another step 112 along the third direction Z, the steps 112 are arranged in an array along the first direction X and the second direction Y, and adjacent ones of the steps 112 are electrically insulated from each other; and a plurality of contact structures 103, where the contact structure 103 is in contact with and connected to the step 112, and any two of the contact structures 103 are spaced from each other.

Figure 2:
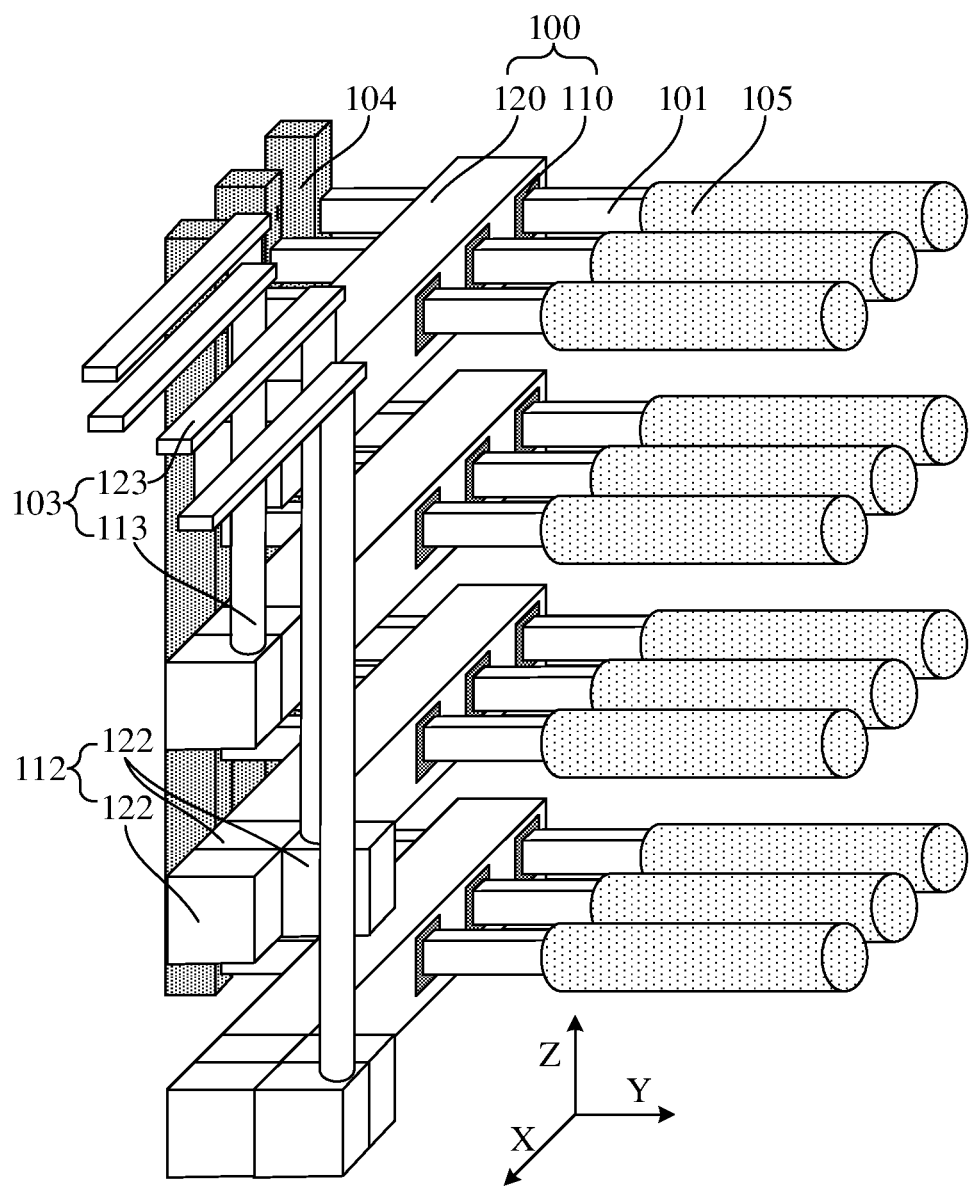

It should be noted that, referring to FIG. 1 and FIG. 2, the word line 100 includes gate dielectric layers 110 and a gate 120, where the gate dielectric layer 110 surrounds part of a sidewall of the semiconductor channel 101, the gate dielectric layers 110 and the semiconductor channels 101 one-to-one correspond to each other, and the gate 120 extends along the first direction X and surrounds a sidewall of the gate dielectric layer 110. The gate dielectric layer 110 is made of an insulating material and the gate 120 is made of a conductive material.

In some embodiments, referring to FIG. 5, the stepped structure 102 includes substeps 122 arranged along the first direction X and/or the second direction Y, where some of the substeps 122 constitute one step 112.

FIG. 1 and FIG. 2 show only four word lines 100 arranged at intervals along the third direction Z, sequentially including a first word line, a second word line, a third word line, and a fourth word line along a direction of the contact structure 103 pointing to the step 112. A step 112 provided on a same layer as the first word line includes one substep 122; a step 112 provided on a same layer as the second word line includes two substeps 122, there is an additional substep 122 along the first direction X compared with the substep 122 corresponding to the first word line, and a contact structure 103 corresponding to the second word line is in contact with and connected to the additional substep 122; a step 112 provided on a same layer as the third word line includes three substeps 122, there is an additional substep 122 along the second direction Y compared with the two substeps 122 corresponding to the second word line, and a contact structure 103 corresponding to the third word line is in contact with and connected to the additional substep 122; and a step 112 provided on a same layer as the fourth word line includes four substeps 122, there is an additional substep 122 along the first direction X compared with the three substeps 122 corresponding to the third word line, and a contact structure 103 corresponding to the fourth word line is in contact with and connected to the additional substep 122. In this way, the realization of the overall tendency of the steps 112 being arranged in an array along the first direction X and the second direction Y and the realization of any two of the contact structures 103 spaced from each other facilitate the prevention of contact between contact structures 103 corresponding to different word lines 100 to reduce the interference between the different word lines 100.

It should be noted that, in FIG. 1 and FIG. 2, only four word lines 100 are used as an example for description. During actual application, a quantity of word lines 100 included in a semiconductor structure is not limited. In addition, in FIG. 1 and FIG. 2, to show the difference between steps 112 in contact with word lines 100 located on different layers, differences of quantities and arrangement manners of substeps 122 included in steps 112 located on the different layers are used for presentation. During actual application, a single step 112 may include a plurality of substeps 122 independent of each other, that is, the plurality of substeps 122 are separately manufactured, or the single step 112 is an integrated structure, and the substep 122 is a feature defined only to show a difference between different steps 112, that is, a plurality of substeps 122 constituting the single step 112 are an integrated structure.

Figure 3:
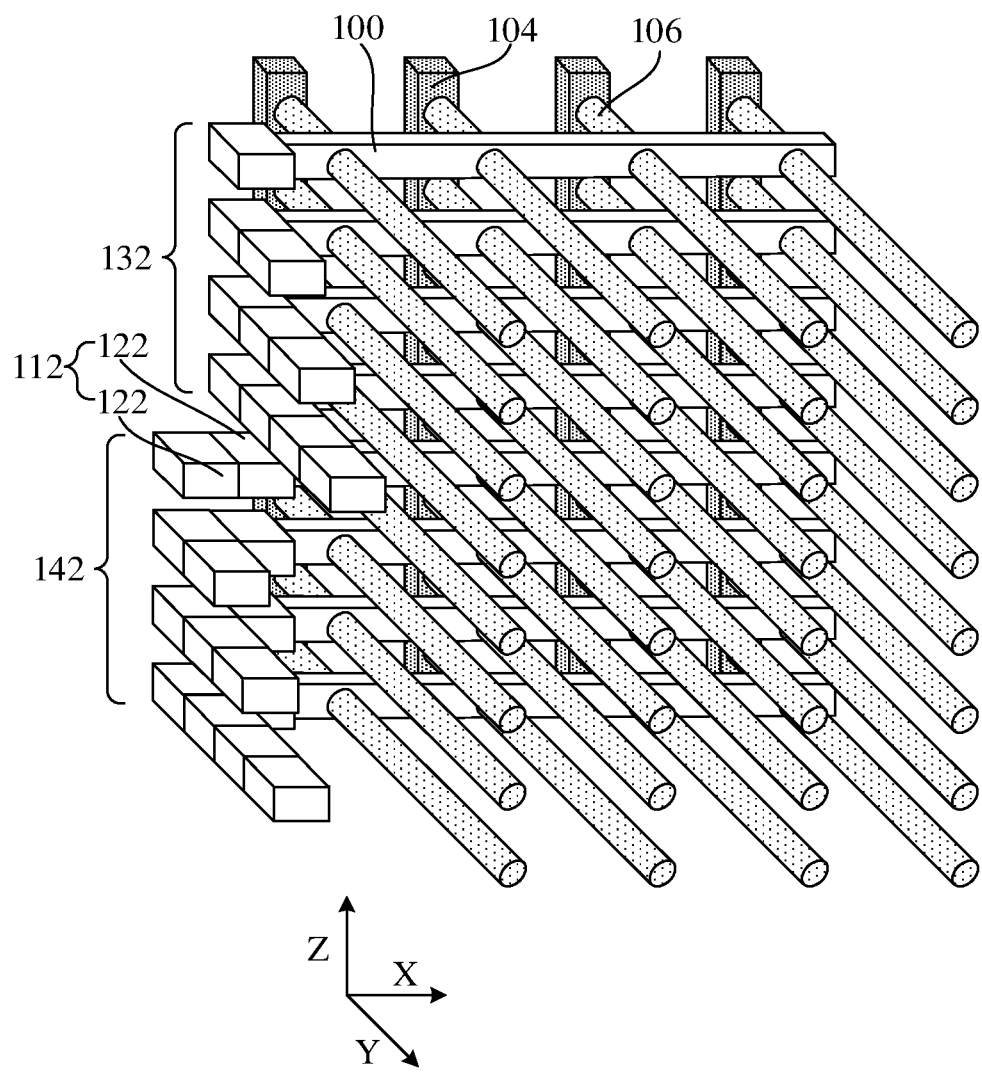
Figure 4:
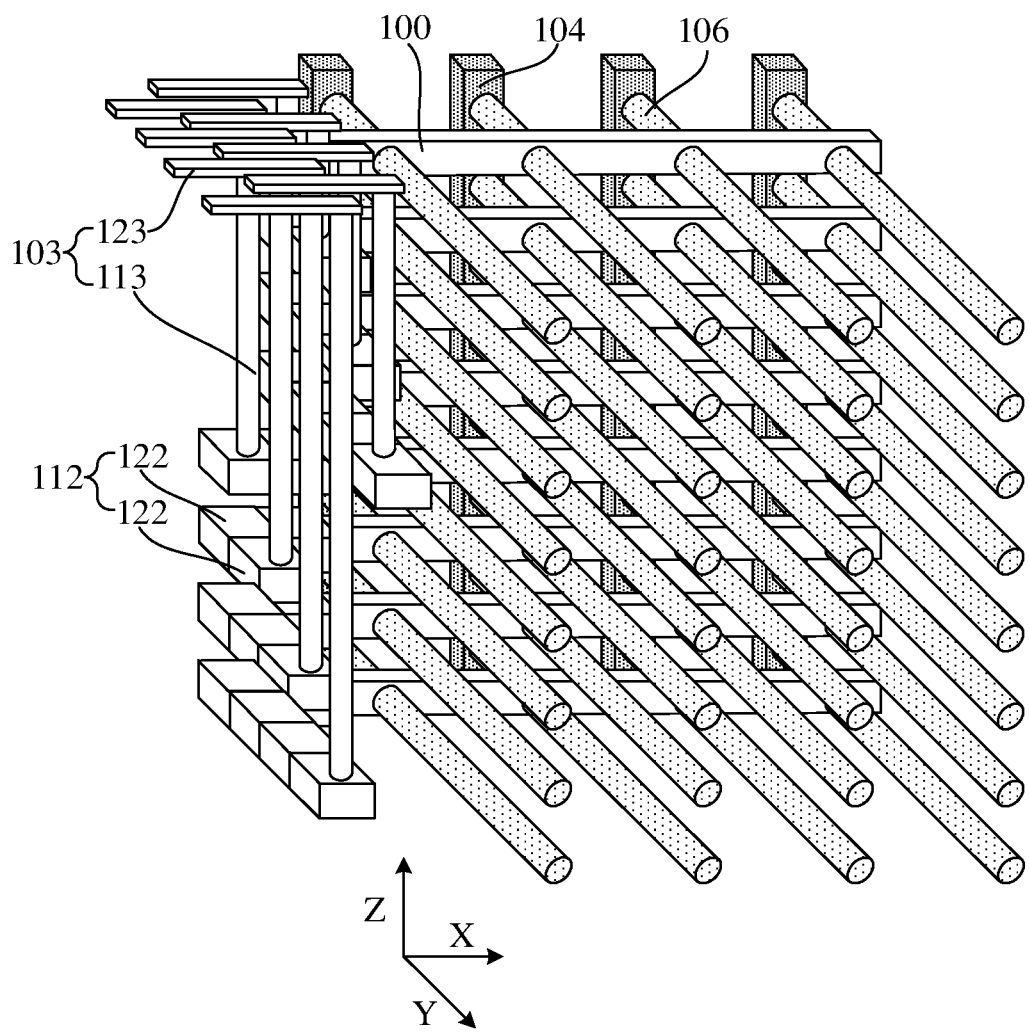

FIG. 3 and FIG. 4 show only eight word lines 100 arranged at intervals along the third direction Z. In addition, referring to FIG. 5, in the step 112, a maximum of two substeps 122 are arranged along the first direction X, and a maximum of four substeps 122 are arranged along the second direction Y. In addition, there are eight substeps 122 whose top surfaces are exposed in the stepped structure 102, where the top surfaces of the eight substeps 122 are in contact with and connected to different contact structures 103, to provide signals by the different contact structures 103 for different word lines 100.

It should be noted that, in FIG. 3 and FIG. 4, only eight word lines 100 are used as an example for description. During actual application, a quantity of word lines 100 included in a semiconductor structure is not limited. In addition, in FIG. 3 to FIG. 5, to show the difference between steps 112 in contact with word lines 100 located on different layers, differences of quantities and arrangement manners of substeps 122 included in steps 112 located on the different layers are used for presentation. During actual application, a single step 112 may include a plurality of substeps 122 independent of each other, that is, the plurality of substeps 122 are separately manufactured, or the single step 112 is an integrated structure, and the substep 122 is a feature defined only to show a difference between different steps 112, that is, a plurality of substeps 122 constituting the single step 112 are an integrated structure.

In some embodiments, referring to FIG. 2, FIG. 3, and FIG. 5, the steps 112 in the stepped structure 102 one-to-one correspond to the word lines 100, that is, one step 112 is in contact with and connected to one word line 100, to help provide signals by different contact structures 103 by using different steps 112 for different word lines 100.

In some embodiments, still referring to FIG. 1 to FIG. 4, the semiconductor channels 101 are arranged in an array along the first direction X and the third direction Z, and the word line 100 surrounds a plurality of semiconductor channels 101 arranged along the first direction X. In this way, it is implemented that, along the third direction Z, a plurality of semiconductor channels 101 located on a same layer are controlled by a same word line 100 and a plurality of semiconductor channels 101 located on different layers are controlled by different word lines 100. It should be noted that, in FIG. 1 and FIG. 2, that a word line 100 surrounds three semiconductor channels 101 arranged along the first direction X is used as an example, and in FIG. 3 and FIG. 4, that a word line 100 surrounds four semiconductor channels 101 arranged along the first direction X is used as an example. During actual application, a quantity of semiconductor channels 101 arranged along the first direction X and surrounded by a same word line 100 is not limited, for example, is 6 or 8.

In some embodiments, referring to FIG. 4 and FIG. 5, along a direction away from the word line 100, heights of top surfaces of a plurality of steps 112 arranged along the first direction X gradually decrease, and heights of top surfaces of a plurality of steps 112 arranged along the second direction Y also gradually decrease. In this way, on the one hand, the steps 112 are arranged in an array along the first direction X and the second direction Y, and on the other hand, a height of a top surface of any one of the steps 112 is different from a height of a top surface of another step 112 along the third direction Z. It should be noted that, in FIG. 1 to FIG. 5, along the direction away from the word line 100, the heights of the top surfaces of the plurality of steps 112 arranged along the first direction X present a gradually decreasing tendency, and the heights of the top surfaces of the plurality of steps 112 arranged along the second direction Y also present a gradually decreasing tendency. During actual application, changing tendencies of heights of top surfaces of different steps 112 in the stepped structure 102 along the first direction X and the second direction Y are not limited, provided that the height of the top surface of any one of the steps 112 is different from the height of the top surface of the another step 112.

Still referring to FIG. 3 and FIG. 5, the steps 112 include a plurality of step groups arranged along the first direction X, the step group includes a plurality of steps 112 arranged along the second direction Y, a step group close to the word line 100 is a first step group 132, a step group adjacent to a side of the first step group 132 away from the word line 100 is a second step group 142, a step 112 with a top surface of a lowest height in steps 112 in the first step group 132 is a first reference step 152, a step 112 with a top surface of a highest height in steps 112 in the second step group 142 is a second reference step 162, and the height of the top surface of the first reference step 152 is greater than the height of the top surface of the second reference step 162.

It should be noted that the stepped structure 102 shown in FIG. 3 to FIG. 5 is merely a specific example, that is, one step group in FIG. 5 includes four steps 112 and the stepped structure 102 includes two step groups. During actual application, arrangement manners of different steps 112 in the stepped structure 102 are not limited, provided that a height of a top surface of any one of the steps 112 is different from a height of a top surface of another step 112. For example, in an example, the steps may alternatively include a plurality of step groups arranged along the second direction, and the step group includes a plurality of steps arranged along the first direction. For example, when eight word lines need to be in contact with and connected to eight steps with top surfaces of different heights, the stepped structure 102 may include four step groups along the second direction, where one of the step groups includes two steps 112.

In some embodiments, referring to FIG. 5, a first gap exists between adjacent ones of the steps 112 along the third direction Z, and the stepped structure 102 further includes a plurality of insulating layers 107, where one of the insulating layers 107 fills up at least one first gap. In this way, different steps 112 are electrically insulated from each other by using the insulating layer 107.

In some embodiments, referring to FIG. 1 to FIG. 4, heights of top surfaces of the steps 112 are flush with heights of top surfaces of structures of the word lines 100 in a one-to-one correspondence along the third direction Z. In this way, on the one hand, one end face of the step 112 completely fits one end face of the word line 100, to increase a contact area between the step 112 and the word line 100, such that a contact resistance between the step 112 and the word line 100 is reduced; on the other hand, the heights of the top surfaces of the steps 112 are flush with the heights of the top surfaces of the structures of the word lines 100 in a one-to-one correspondence, to facilitate the improvement of overall stability of the semiconductor structure, and facilitate the manufacturing of the step 112 while manufacturing the word line 100, such that a manufacturing process of the semiconductor structure is simplified.

In some embodiments, referring to FIG. 6, heights of top surfaces of the contact structures 103 are flush along the third direction Z, the steps 112 include a plurality of first steps 172 arranged along the first direction X, and a plurality of contact structures 103 in contact with and connected to the plurality of first steps 172 are arranged at intervals along the second direction Y.

It may be understood that, referring to FIG. 6, the plurality of first steps 172 arranged along the first direction X are located on different layers, and by using a cross section perpendicular to the third direction Z (referring to FIG. 7) as a first reference surface, orthographic projection of the plurality of first steps 172 on the first reference surface partially coincides with each other. In this way, the plurality of contact structures 103 in contact with and connected to the plurality of first steps 172 are arranged at intervals along the second direction Y. This is beneficial to preventing orthographic projection of contact structures 103 in contact with and connected to different first steps 172 on the first reference surface from coinciding with each other. In this case, when the heights of the top surfaces of the contact structures 103 are flush, interference caused by mutual contact between different contact structures 103 is avoided, such that any two of the contact structures 103 are spaced from each other, thereby preventing the contact structures 103 corresponding to the different word lines 100 from being in contact with each other.

It should be noted that, in FIG. 6, that a stepped structure 102 includes 64 steps 112 arranged in an 8*8 array is used as an example, that is, eight steps 112 are arranged along the first direction X and eight steps 112 are arranged along the second direction Y. During actual application, a quantity of steps 112 included in the stepped structure 102 is not limited, provided that the quantity of steps 112 is consistent with a quantity of the word lines 100. In addition, during actual application, a quantity of steps 112 arranged along the first direction X and a quantity of steps arranged along the second direction Y are also not limited, and an arrangement status of the steps 112 along the first direction X and the second direction Y may be designed according to an actual requirement.

Referring to FIG. 7, the semiconductor structure may include: a plurality of word lines 100 extending along a first direction X and arranged at intervals along a third direction Z; and a plurality of semiconductor channels 101 extending along a second direction Y and arranged at intervals along the third direction Z, where the word line 100 surrounds the semiconductor channel 101 along the third direction Z, and the first direction X, the second direction Y, and the third direction Z intersect one another. In addition, in FIG. 7, extension lengths of different word lines 100 are different along the first direction X. Therefore, a connection pillar 130 may be provided at a position at which the extension lengths of the different word lines 100 are different. Subsequently, different connection pillars 130 are connected to different conductive layers (not shown in the figure), to provide signals by the different conductive layers for different word lines 100.

However, a cross section perpendicular to the third direction Z is a first reference surface, and in FIG. 7, orthographic projection of four word lines 100 on the first reference surface partially coincides with each other. In this case, there is the following case: coordinates of connection pillars 130 in contact with and connected to different word lines 100 are the same in the second direction Y. When conductive layers subsequently in contact with and connected to the connection pillars 130 extend along the first direction X, if top surfaces of different conductive layers are flush with one another, that is, coordinates of contact positions between the different conductive layers and the word lines 100 in the third direction Z are the same, because the coordinates of the different connection pillars 130 are the same in the second direction Y, coordinates of contact positions between the different conductive layers and the word lines 100 are also the same in the second direction Y. Therefore, the coordinates of the contact positions between the different conductive layers and the word lines 100 are the same in the second direction Y and are also the same in the third direction Z, such that the different conductive layers are in contact with each other when extending along the first direction X.

In addition, the different connection pillars 130 are spaced from each other in the third direction Z by using only the extension lengths of the different word lines 100 along the first direction X. As a quantity of the word lines 100 is increased, an overall layout area of a plurality of word lines 100 in the first direction X is also gradually increased.

In addition, the semiconductor structure in FIG. 7 includes bit lines 104 and capacitor structures 105, where the bit lines 104 and the capacitor structures 105 are similar to those in FIG. 1 to FIG. 4, and details are not described herein again.

Referring to FIG. 1 and FIG. 2, in the semiconductor structure, the steps 112 in the stepped structure 102 are arranged in an array along the first direction X and the second direction Y. Comparatively referring to FIG. 7 and FIG. 1 and FIG. 2, in the semiconductor structure in FIG. 1 and FIG. 2, as the quantity of word lines 100 is increased, the steps 112 may be arranged along two directions, namely, the first direction X and the second direction Y, instead of being arranged along only one of the directions, such that layout space of the semiconductor structure can be appropriately utilized, thereby decreasing a total layout area of the semiconductor structure.

Referring to FIG. 1 to FIG. 5, in the semiconductor structure, a height of a top surface of any one of the steps 112 is different from a height of a top surface of another step 112 along the third direction Z, to facilitate a one-to-one correspondence between the steps 112 and the word lines 100, that is, one step 112 and one word line 100 may be located on a same layer. In addition, referring to FIG. 6, the plurality of contact structures 103 in contact with and connected to the plurality of first steps 172 are arranged at intervals along the second direction Y.

Comparatively referring to FIG. 7 and FIG. 1 to FIG. 6, in the semiconductor structure provided in FIG. 1 to FIG. 6, coordinates of contact positions between different contact structures 103 and the steps 112 are different in the first direction X and are also different in the second direction Y. Therefore, when heights of top surfaces of the contact structures 103 are flush, and the contact structures 103 extend along the first direction X, a case in which different contact structures 103 are in contact with each other does not exist, to ensure that any two of the contact structures 103 are spaced from each other, and facilitate the prevention of contact between contact structures 103 corresponding to different word lines 100, thereby reducing interference between the different word lines 100.

It should be noted that, when the quantity of word lines 100 in the semiconductor structure is relatively few, a manner of controlling extension lengths of different word lines 100 along the first direction X in FIG. 7 is used, to enable different connection pillars 130 to be spaced from each other in the third direction Z, control heights of different connection pillars 130 to be different along the third direction Z, and further prevent conductive layers corresponding to the different word lines 100 from being in contact with each other to reduce interference between the different word lines 100.

In some embodiments, referring to FIG. 1 to FIG. 4, the contact structure 103 may include a conductive pillar 113 and a lead-out layer 123, one end of the conductive pillar 113 is in contact with and connected to the step 112, the other end of the conductive pillar 113 is in contact with and connected to the lead-out layer 123, the lead-out layer 123 extends along the first direction X, and lead-out layers 123 are arranged at intervals along the second direction Y. It may be understood that, conductive pillars 113 are spaced from each other, and the lead-out layers 123 are spaced from each other, such that contact structures 103 constituted by the conductive pillars 113 and the lead-out layers 123 are spaced from each other.

In some embodiments, referring to FIG. 1 to FIG. 4, the semiconductor structure may further include: bit lines 104, where the bit line 104 is in contact with and connected to the plurality of semiconductor channels 101 arranged along the third direction Z.

It should be noted that, in FIG. 1 and FIG. 2, that a quantity of semiconductor channels 101 arranged along the third direction Z is four and the semiconductor structure includes three bit lines 104 is used as an example, and in FIG. 3 and FIG. 4, that a quantity of semiconductor channels 101 arranged along the third direction Z is eight and the semiconductor structure includes four bit lines 104 is used as an example. During actual application, the quantity of semiconductor channels 101 arranged along the third direction Z and a quantity of bit lines 104 included in the semiconductor structure are both not limited and may be each appropriately specified according to an actual requirement.

In some embodiments, referring to FIG. 1 to FIG. 4, the semiconductor structure may further include a plurality of capacitor structures 105, where the capacitor structure 105 is in contact with and connected to a side of the semiconductor channel 101 away from the bit line 104, and the capacitor structure 105 extends along the second direction Y.

In some embodiments, referring to FIG. 3 to FIG. 5, the stepped structure 102 may include substeps 122 arranged along the first direction X and/or the second direction Y, and a quantity of substeps 122 arranged along the second direction Y is greater than a quantity of those arranged along the first direction X. Because the capacitor structure 105 occupies a relatively large layout length in the second direction Y, referring to FIG. 3 to FIG. 5, the quantity of substeps 122 in the stepped structure 102 arranged along the second direction Y is greater than the quantity of those arranged along the first direction X, that is, the stepped structure 102 occupies as much of a layout length as possible in the second direction Y, such that larger part of the stepped structure 102 is located in a region directly opposite to the capacitor structure 105. In this way, a layout length of the semiconductor structure in the first direction X is reduced by reducing the layout length of the stepped structure 102 in the first direction X while not increasing a layout length of the semiconductor structure in the second direction Y. Therefore, layout space is appropriately utilized and a total layout area of the semiconductor structure is decreased.

An arrangement status of the substeps 122 is described in detail by using FIG. 5 as an example below. Referring to FIG. 5, quantities of substeps 122 included in steps 112 located on different layers are all different, substeps 122 in the steps 112 in the first step group 132 are all arranged along the second direction Y, and substeps 122 in the steps 112 in the second step group 142 are all arranged along the first direction X and the second direction Y. During actual application, substeps 122 in some of the steps 112 are arranged along only the first direction X.

It should be noted that, FIG. 1 to FIG. 4 show only a general structure of the capacitor structure 105, and a positional relationship between a top electrode layer, a capacitor dielectric layer, and a bottom electrode layer in the capacitor structure 105 is not limited. In addition, for the clarity of the illustration, the semiconductor channel 101 (referring to FIG. 1) and the capacitor structure 105 (referring to FIG. 1) are represented by a combined structure 106 in FIG. 3 and FIG. 4.

In some embodiments, referring to FIG. 1 to FIG. 5, the second direction Y and the third direction Z constitute a reference surface, the plurality of capacitor structures 105 constitute a capacitor region, and orthographic projection of the stepped structure 102 on the reference surface at least partially coincides with orthographic projection of the capacitor region on the reference surface, that is, at least part of the stepped structure 102 is located in a region directly opposite to the capacitor region. In this way, on the premise that a layout length of the semiconductor structure in the second direction Y is decided by a layout length of the capacitor region in the second direction Y, the stepped structure 102 is laid out as much as possible along the second direction without increasing a layout length of the stepped structure 102 in the first direction X, to reduce the layout length of the stepped structure 102 in the first direction X while not increasing the layout length of the semiconductor structure in the second direction Y, such that a layout length of the semiconductor structure in the first direction X is reduced, thereby appropriately utilizing layout space and reducing a total layout area of the semiconductor structure.

In some embodiments, referring to FIG. 8 and FIG. 9, the bit line 104 includes a first end 114 and a second end 124 that are opposite along the second direction Y; the semiconductor channel 101 (referring to FIG. 1) may include a plurality of first semiconductor channels 111 in contact with and connected to the first end 114 and a plurality of second semiconductor channels 121 in contact with and connected to the second end 124; the word line 100 (referring to FIG. 1) may include a plurality of first word lines 140 surrounding the first semiconductor channels 111 and a plurality of second word lines 150 surrounding the second semiconductor channels 121, where the first word line 140 and the second word line 150 each have a first side 160 and a second side 170 that are opposite along the first direction X; and the stepped structure 102 (referring to FIG. 1) includes: a first stepped structure 182 in contact with and connected to the first word line 140 and a second stepped structure 192 in contact with and connected to the second word line 150, where the first stepped structure 182 is in contact with and connected to one of the first side 160 or the second side 170, and the second stepped structure 192 is in contact with and connected to the other one of the first side 160 or the second side 170.

It may be understood that, the capacitor structure 105 (referring to FIG. 1) may further include: a first capacitor structure (not shown in the figure) in contact with and connected to the first semiconductor channel 111 and a second capacitor structure (not shown in the figure) in contact with and connected to the second semiconductor channel 121.

In this way, two ends of the bit line 104 along the second direction Y may each constitute different transistor structures with different word lines 100 and semiconductor channels 101, and transistor structures on two sides and corresponding capacitor structures on the two sides respectively constitute a plurality of memory cells, to facilitate a further increase of an integration density of semiconductor structures.

It should be noted that, in FIG. 9, a bit line region 134 indicates a region in which the bit lines 104 (referring to FIG. 1) are located, and in FIG. 9, that the first stepped structure 182 is in contact with and connected to the first side 160 and the second stepped structure 192 is in contact with and connected to the second side 170 is used as an example. During actual application, the first stepped structure 182 may be in contact with and connected to the second side 170, and the second stepped structure 192 may be in contact with and connected to the first side 160. In addition, FIG. 8 may be a schematic structural diagram of a partial top view of one stepped structure 102 in FIG. 9.

In some embodiments, referring to FIG. 1 and FIG. 9, the bit line 104, the word line 100, the stepped structure 102, the contact structure 103, and the capacitor structure 105 constitute a memory cell group 108; and the semiconductor structure includes a plurality of memory cell groups 108 arranged at intervals along the second direction Y.

It should be noted that, in FIG. 9, that the semiconductor structure includes eight memory cell groups 108 arranged at intervals along the second direction Y is used as an example. During actual application, a quantity of memory cell groups 108 arranged at intervals along the second direction Y and included in the semiconductor structure is not limited and the quantity of the memory cell groups 108 may be appropriately specified according to a requirement on a storage capacity of the semiconductor structure.

In some embodiments, referring to FIG. 6, FIG. 8, and FIG. 9, the contact structures 103 may include first contact structures (not shown in the figure) in contact with and connected to the first stepped structure 182 and second contact structures (not shown in the figure) in contact with and connected to the second stepped structure 192; and the semiconductor structure may further include: a first word line driver 118 located on a side of the first stepped structure 182 away from the first word line 140, where the first word line driver 118 is electrically connected to all of the first contact structures; and a second word line driver 128 located on a side of the second stepped structure 192 away from the second word line 150, where the second word line driver 128 is electrically connected to all of the second contact structures.

It may be understood that, the first word line driver 118 is configured to provide a signal for the first word line 140 by using the first contact structure, and the second word line driver 128 is configured to provide a signal for the second word line 150 by using the second contact structure.

In some embodiments, still referring to FIG. 9, the semiconductor structure may further include a first sense amplifier 109 electrically connected to the first contact structures and a second sense amplifier 119 electrically connected to the second contact structures.

It should be noted that, in FIG. 9, that the first word line driver 118 and the second word line driver 128 are respectively located on two sides, namely, left and right sides, of the memory cell group 108 along the first direction X is used as an example, and that the first sense amplifier 109 and the second sense amplifier 119 are respectively located on two sides, namely, upper and lower sides, of the memory cell group 108 along the second direction Y is used as an example. During actual application, a positional relationship between each of the first word line driver 118, the second word line driver 128, the first sense amplifier 109, and the second sense amplifier 119 and the memory cell group 108 is not limited, provided that the first word line driver 118 is electrically connected to all of the first contact structures, the second word line driver 128 electrically connected to all of the second contact structures, the first sense amplifier 109 is electrically connected to the first contact structures, and the second sense amplifier 119 is electrically connected to the second contact structures.

In conclusion, the word lines 100 are arranged at intervals along the third direction Z, different word lines 100 locate in different height intervals in the third direction Z, the steps 112 in the stepped structure 102 are in contact with and connected to the word lines 100, and the height of the top surface of any of the steps 112 is different from the height of the top surface of the another step 112 along the third direction Z, to facilitate a one-to-one correspondence between the steps 112 and the word lines 100, such that the word lines 100 are lead out through the steps 112; and further, the contact structures 103 are in contact with and connected to the steps 112 to further lead out the word lines 100, and any two of the contact structures 103 are spaced from each other, to facilitate the prevention of contact between contact structures 103 corresponding to different word lines 100, such that interference between the different word lines 100 is reduced. In addition, the steps 112 are arranged in an array along the first direction X and the second direction Y, to avoid a case in which the stepped structure 102 extends along only the first direction X or the second direction Y, such that layout space is appropriately utilized, which is beneficial to reducing a total layout area of the semiconductor structure.

The embodiments or implementations of this specification are described in a progressive manner, and each embodiment focuses on differences from other embodiments. The same or similar parts between the embodiments may refer to each other.

In the description of this specification, the description with reference to terms such as "an embodiment", "an exemplary embodiment", "some implementations", "a schematic implementation", and "an example" means that the specific feature, structure, material, or characteristic described in combination with the implementation(s) or example(s) is included in at least one implementation or example of the present disclosure.

In this specification, the schematic expression of the above terms does not necessarily refer to the same implementation or example. Moreover, the described specific feature, structure, material or characteristic may be combined in an appropriate manner in any one or more implementations or examples.

It should be noted that in the description of the present disclosure, the terms such as "center", "top", "bottom", "left", "right", "vertical", "horizontal", "inner" and "outer" indicate the orientation or position relationships based on the accompanying drawings. These terms are merely intended to facilitate description of the present disclosure and simplify the description, rather than to indicate or imply that the mentioned apparatus or element must have a specific orientation and must be constructed and operated in a specific orientation. Therefore, these terms should not be construed as a limitation to the present disclosure.

It can be understood that the terms such as "first" and "second" used in the present disclosure can be used to describe various structures, but these structures are not limited by these terms. Instead, these terms are merely intended to distinguish one structure from another.

The same elements in one or more accompanying drawings are denoted by similar reference numerals. For the sake of clarity, various parts in the accompanying drawings are not drawn to scale. In addition, some well-known parts may not be shown. For the sake of brevity, a structure obtained by implementing a plurality of steps may be shown in one figure. In order to understand the present disclosure more clearly, many specific details of the present disclosure, such as the structure, material, size, processing process, and technology of the device, are described below. However, as those skilled in the art can understand, the present disclosure may not be implemented according to these specific details.

Finally, it should be noted that the above embodiments are merely intended to explain the technical solutions of the present disclosure, rather than to limit the present disclosure. Although the present disclosure is described in detail with reference to the above embodiments, those skilled in the art should understand that they may still modify the technical solutions described in the above embodiments, or make equivalent substitutions of some or all of the technical features recorded therein, without deviating the essence of the corresponding technical solutions from the scope of the technical solutions of the embodiments of the present disclosure.

INDUSTRIAL APPLICABILITY

In the semiconductor structure provided in the embodiments of the present disclosure, the word lines are arranged at intervals along the third direction, different word lines locate in different height intervals in the third direction, the steps in the stepped structure are in contact with and connected to the word lines, and the height of the top surface of any of the steps is different from the height of the top surface of the another step along the third direction, to facilitate a one-to-one correspondence between the steps and the word lines, such that the word lines are lead out through the steps; and further, the contact structures are in contact with and connected to the steps to further lead out the word lines, and any two of the contact structures are spaced from each other, to facilitate the prevention of contact between contact structures corresponding to different word lines, such that interference between the different word lines is reduced. In addition, the steps are arranged in an array along the first direction and the second direction, to avoid a case in which the stepped structure extends along only the first direction or the second direction, such that layout space is appropriately utilized, which is beneficial to reducing a total layout area of the semiconductor structure.

The invention claimed is:

1. A semiconductor structure, comprising:
   a plurality of word lines extending along a first direction and arranged at intervals along a third direction;
   a plurality of semiconductor channels extending along a second direction and arranged at intervals along the third direction, wherein the word line surrounds the semiconductor channel along the third direction, and the first direction, the second direction, and the third direction intersect one another;
   a stepped structure comprising a plurality of steps, wherein the step is in contact with and connected to the word line, a height of a top surface of any one of the steps is different from a height of a top surface of another one of the steps along the third direction, the steps are arranged in an array along the first direction and the second direction, and adjacent ones of the steps are electrically insulated from each other; and
   a plurality of contact structures, wherein the contact structure is in contact with and connected to the step, and any two of the contact structures are spaced from each other.

2. The semiconductor structure according to claim 1, wherein the semiconductor channels are arranged in an array along the first direction and the third direction, and the word line surrounds a plurality of the semiconductor channels arranged along the first direction.

3. The semiconductor structure according to claim 1, wherein along a direction away from the word line, heights of top surfaces of a plurality of the steps arranged along the first direction gradually decrease, and heights of top surfaces of a plurality of the steps arranged along the second direction also gradually decrease.

4. The semiconductor structure according to claim 3, wherein the steps comprise a plurality of step groups arranged along the first direction, the step group comprises a plurality of the steps arranged along the second direction, a step group close to the word line is a first step group, a step group adjacent to a side of the first step group away from the word line is a second step group, a step whose top surface has a lowest height among the steps in the first step group is a first reference step, a step whose top surface has a highest height among the steps in the second step group is a second reference step, and the height of the top surface of the first reference step is greater than the height of the top surface of the second reference step.

5. The semiconductor structure according to claim 1, wherein heights of top surfaces of the steps are flush with heights of top surfaces of structures of the word lines in a one-to-one correspondence along the third direction.

6. The semiconductor structure according to claim 1, wherein heights of top surfaces of the contact structures are flush along the third direction, the steps comprise a plurality of first steps arranged along the first direction, and a plurality of the contact structures in contact with and connected to the plurality of first steps are arranged at intervals along the second direction.

7. The semiconductor structure according to claim 1, wherein the contact structure comprises a conductive pillar and a lead-out layer, one end of the conductive pillar is in contact with and connected to the step, the other end of the conductive pillar is in contact with and connected to the lead-out layer, the lead-out layer extends along the first direction, and lead-out layers are arranged at intervals along the second direction.

8. The semiconductor structure according to claim 1, further comprising: bit lines, wherein the bit line is in contact with and connected to a plurality of the semiconductor channels arranged along the third direction.

9. The semiconductor structure according to claim 8, further comprising: a plurality of capacitor structures, wherein the capacitor structure is in contact with and connected to a side of the semiconductor channel away from the bit line, and the capacitor structure extends along the second direction.

10. The semiconductor structure according to claim 9, wherein the second direction and the third direction constitute a reference surface, the plurality of capacitor structures constitute a capacitor region, and an orthographic projection of the stepped structure on the reference surface at least partially coincides with an orthographic projection of the capacitor region on the reference surface.

11. The semiconductor structure according to claim 9, wherein the bit line comprises a first end and a second end that are opposite along the second direction; the semiconductor channels comprise a plurality of first semiconductor channels in contact with and connected to the first end and a plurality of second semiconductor channels in contact with and connected to the second end; the word lines comprise a plurality of first word lines surrounding the first semiconductor channels and a plurality of second word lines surrounding the second semiconductor channels, wherein the first word line and the second word line each have a first side and a second side that are opposite along the first direction; and the stepped structure comprises a first stepped structure in contact with and connected to the first word line and a second stepped structure in contact with and connected to the second word line, wherein the first stepped structure is in contact with and connected to one of the first side or the second side, and the second stepped structure is in contact with and connected to the other one of the first side or the second side.

12. The semiconductor structure according to claim 11, wherein the bit line, the word line, the stepped structure, the contact structure, and the capacitor structure constitute a memory cell group; and the semiconductor structure comprises a plurality of the memory cell groups arranged at intervals along the second direction.

13. The semiconductor structure according to claim 11, wherein the contact structures comprise first contact structures in contact with and connected to the first stepped structure and second contact structures in contact with and connected to the second stepped structure; and the semiconductor structure further comprises:

a first word line driver, located on a side of the first stepped structure away from the first word line, wherein the first word line driver is electrically connected to all of the first contact structures; and a second word line driver, located on a side of the second stepped structure away from the second word line, wherein the second word line driver is electrically connected to all of the second contact structures.

14. The semiconductor structure according to claim 13, further comprising:

a first sense amplifier, electrically connected to the first contact structures; and a second sense amplifier, electrically connected to the second contact structures.

15. The semiconductor structure according to claim 1, wherein the stepped structure comprises substeps arranged along at least one of the first direction or the second direction, and a quantity of the substeps arranged along the second direction is greater than a quantity of the substeps arranged along the first direction.

* * * * *